(12) United States Patent
Ishii et al.

(10) Patent No.: US 7,935,975 B2
(45) Date of Patent: May 3, 2011

(54) WHITE LED LAMP AND BACKLIGHT USING THE SAME, AND LIQUID CRYSTAL DISPLAY DEVICE USING THE BACKLIGHT

(75) Inventors: Tsutomu Ishii, Yokohama (JP); Yasuhiro Shirakawa, Yokohama (JP); Hajime Takeuchi, Yokohama (JP); Ryo Sakai, Yokohama (JP); Yasumasa Ooya, Chigasaki (JP)

(73) Assignees: Kabushiki Kaisha Toshiba, Tokyo (JP); Toshiba Materials Co., Ltd., Kanagawa-ken (JP)

( * ) Notice: Subject to any disclaimer, the term of this patent is extended or adjusted under 35 U.S.C. 154(b) by 245 days.

(21) Appl. No.: 11/992,787

(22) PCT Filed: Sep. 12, 2006

(86) PCT No.: PCT/JP2006/318054
§ 371 (c)(1), (2), (4) Date: Jun. 11, 2008

(87) PCT Pub. No.: WO2007/037120
PCT Pub. Date: Apr. 5, 2007

(65) Prior Publication Data
US 2009/0272985 A1    Nov. 5, 2009

(30) Foreign Application Priority Data

Sep. 29, 2005  (JP) .................. 2005-285621

(51) Int. Cl.
*H01L 33/00*    (2010.01)
(52) U.S. Cl. ..... 257/98; 257/88; 257/100; 257/E33.061; 257/E33.067
(58) Field of Classification Search ............. 257/79–105
See application file for complete search history.

(56) References Cited

U.S. PATENT DOCUMENTS

2004/0056256 A1    3/2004  Bokor et al.
(Continued)

FOREIGN PATENT DOCUMENTS

DE    10036940 A1    2/2002
(Continued)

OTHER PUBLICATIONS

Tadatomo, Kazuyuki, et al., "3 Nacho Keikotaigata Hakushoku LED no Kaihatsu", (Development of White LED Fabricated by RGB Phosphor and Near Ultra-Violet LED), Mitsubishi Cable Industries Review, vol. 99, 2002 Nen 7 Gatsu, pp. 35 to 41 (with summary in English).

(Continued)

*Primary Examiner* — N Drew Richards
*Assistant Examiner* — Mamadou Diallo
(74) *Attorney, Agent, or Firm* — Harness, Dickey & Pierce, PLC

(57) ABSTRACT

Disclosed is a white LED lamp using an ultraviolet light emitting LED, which can simultaneously realize a high level of color rendering and a high level of brightness. Included is an LED chip 2 having a luminescence wavelength between 360 nm and 440nm, and a light emitting part excitable upon exposure to light from the LED chip 2 to emit white light and comprising a phosphor, the phosphor including blue, green, and red light emitting phosphors bonded to each other. A phosphor selected from europium-activated halophosphate phosphors and europium-activated aluminate phosphors is used as the blue light emitting phosphor. A gold- and aluminum-activated zinc sulfide phosphor is used as the green light emitting phosphor. A phosphor selected from europium- and samarium-activated lanthanum oxysulfide phosphors and copper- and manganese-activated zinc sulfide phosphors is used as the red light emitting phosphor.

8 Claims, 2 Drawing Sheets

U.S. PATENT DOCUMENTS

| | | |
|---|---|---|
| 2006/0055315 A1 | 3/2006 | Bokor et al. |
| 2006/0071587 A1* | 4/2006 | Yamaguchi et al. .......... 313/364 |
| 2006/0071591 A1 | 4/2006 | Takezawa et al. |

FOREIGN PATENT DOCUMENTS

| | | |
|---|---|---|
| EP | 1305833 A1 | 5/2003 |
| JP | 11-246857 A | 9/1999 |
| JP | 2000-073052 A | 3/2000 |
| JP | 2001-148516 A | 5/2001 |
| JP | 2004-505470 A | 2/2004 |
| JP | 2004-088009 A | 3/2004 |
| JP | 2004-331934 A | 11/2004 |
| JP | 2006-073816 A | 3/2006 |
| WO | WO-02/11214 A1 | 2/2002 |

OTHER PUBLICATIONS

Taiwanese Office Action in related Taiwan Application No. 95134055, dated Apr. 23, 2009, including English translation.

PCT International Preliminary Report on Patentability; mailed May 14, 2008.

* cited by examiner

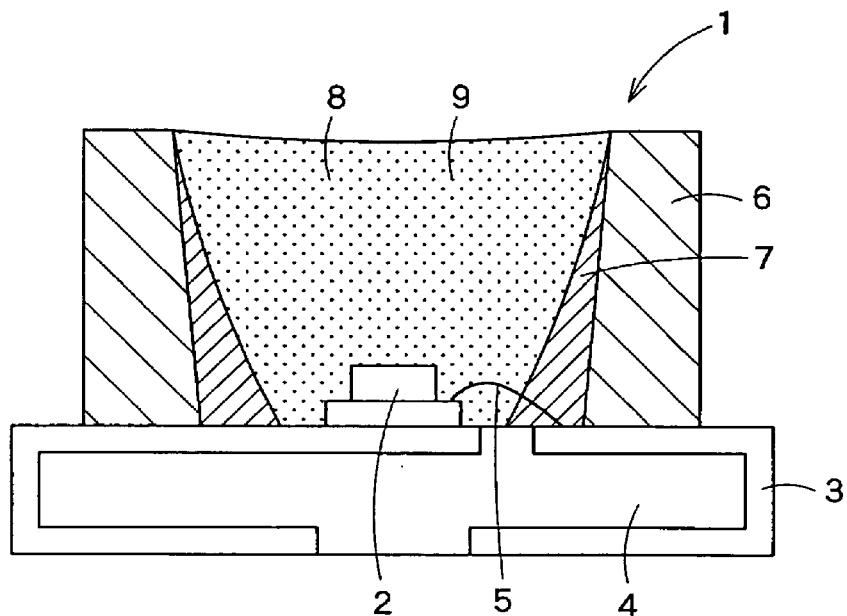
F I G. 1
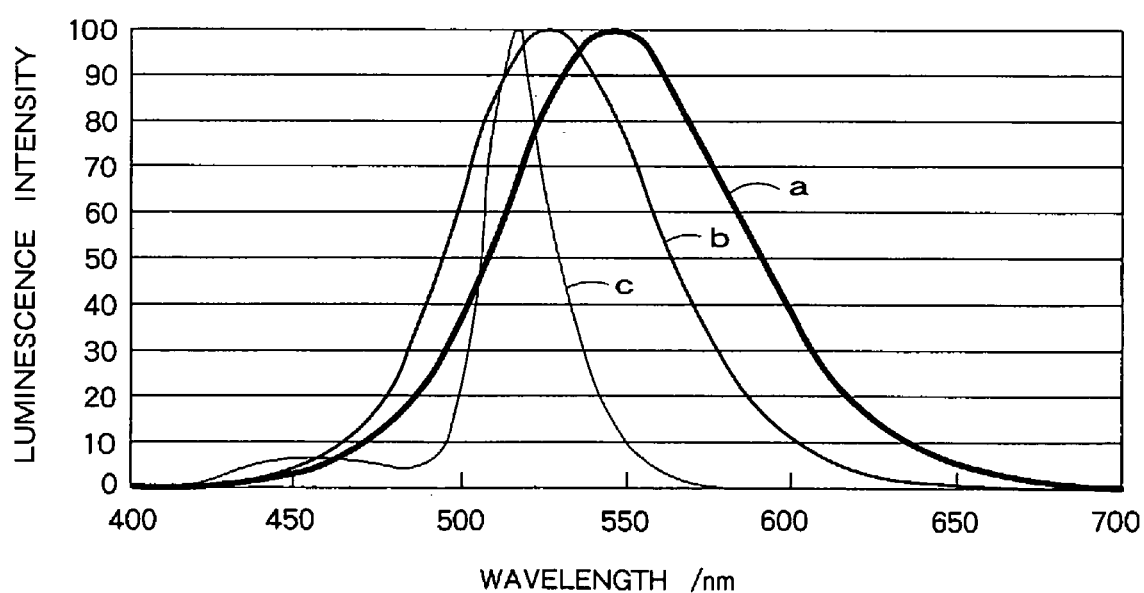
F I G. 2

WHITE LED LAMP AND BACKLIGHT USING THE SAME, AND LIQUID CRYSTAL DISPLAY DEVICE USING THE BACKLIGHT

TECHNICAL FIELD

This invention relates to a white LED lamp using a light emitting diode (LED) with a luminescence wavelength of 360 to 440 nm as a light source and a backlight using the white LED lamp, and a liquid crystal display device.

BACKGROUND ART

LEDs are semiconductor elements for converting electric energy to light such as ultraviolet light or visible light which is then radiated. LED lamps comprising the LED chip sealed, for example, with a transparent resin are used in various fields. LED chips are semiconductor elements and thus have a prolonged service life, a high level of reliability, and, when used as a light source, can reduce replacement work and the like. Accordingly, LED chips have become extensively used as components constituting various display devices, for example, for portable communication equipment, PC peripheral devices, OA equipment, domestic electric appliances, signal devices, various switches, and backlight-type display boards.

The color tone of light emitted from the LED lamp is not limited to the luminescence wavelength of the LED chip. For example, light in a visible light region from blue light to red light depending upon applications, where the LED lamp is used, can be provided by coating a phosphor onto the surface of the LED chip, or by incorporating a phosphor in a transparent resin for sealing the LED chip. In particular, the white LED lamp has rapidly been used in applications such as backlight in a display part of portable communication equipment and on-vehicle lamps, and the applications are expected to be significantly expanded as an alternative to fluorescent lamps in the future.

At the present time, an LED lamp comprising a combination of a blue light emitting LED with a yellow light emitting phosphor (for example, YAG) and an LED lamp comprising a combination of an ultraviolet light emitting LED with a mixture of a blue light emitting phosphor, a green light emitting phosphor, and a red light emitting phosphor are known as white LED lamps which are used widely or experimentally used. At the present time, as compared with the latter white LED lamp, the former white LED lamp using a blue light emitting LED has better brightness properties and the like and thus is used more widely. The former white LED lamp has a drawback that the emitted light is viewed as a yellowish light in some viewing direction and, when the emitted light is projected on a white face, uneven yellow or blue color appears. For this reason, the former white LED lamp is sometimes called as "pseudo white." Regarding the average color rendering index representing the quality of white light as well, the former white LED lamp is up to 70 to 75.

On the other hand, the latter white LED lamp using an ultraviolet light emitting LED is inferior in brightness to the former white LED lamp but causes no significant uneven luminescence and projected light. Accordingly, the latter white LED lamp is expected to become a main stream of white lamps for lighting applications in the future, and the development of the latter white LED lamp has been rapidly forwarded. In the white LED lamp using an ultraviolet light emitting LED, in addition to the properties of each color light emitting phosphor, a combination of these phosphors affects lamp characteristics such as color rendering properties and brightness. Accordingly, studies on the selection of each of blue light, green light, and red light emitting phosphors and combinations thereof have been forwarded.

For example, nonpatent document 1 describes a white LED lamp comprising a combination of an ultraviolet light emitting LED, with a europium(Eu)-activated halophosphate phosphor or a europeum(Eu)-activated aluminate phosphor as a blue light emitting phosphor, a copper(Cu)-and aluminum(Al)-activated zinc sulfide phosphor or a europium(Eu)- and manganese(Mn)-activated aluminate phosphor as a green light emitting phosphor, and a europeum(Eu)-activated yttrium oxysulfide phosphor as a red light emitting phosphor. Further, patent document 1 describes that a europium(Eu)-activated halophosphate phosphor or a europium(Eu)-activated aluminate phosphor, a europium(Eu)-and manganese (Mn)-activated aluminate phosphor, and a europium(Eu)-activated lanthanum oxysulfide phosphor are used as a blue light emitting phosphor, a green light emitting phosphor, and a red color emitting phosphor, respectively.

[Non-patent document 1] MITSUBISHI CABLE INDUSTRIES, LTD., Newsletter Vol. 99, July, 2002.

[Patent document 1] Japanese Patent Laid-Open No. 073052/2000

DISCLOSURE OF INVENTION

Problem to be Solved by the Invention

The conventional white LED lamp has features of a high level of color rendering properties and homogeneous luminescence which are features of lamps using an ultraviolet light emitting LED but, on the other hand, the brightness property is unsatisfactory. Accordingly, there is a demand for further improvement in the conventional white LED lamp. The presence of light with a wavelength around 450 nm, light with a wavelength around 560 nm, and light with a wavelength around 620 nm, in which a color sensitivity peak of human being is present, in a good balance in a white light spectrum, and a good balance among luminescence efficiency of a blue light emitting phosphor, luminescence efficiency of a green light emitting phosphor, and luminescence efficiency of a red light emitting phosphor are required for simultaneously realizing a high level of color rendering properties and a high level of brightness by a white LED lamp using an ultraviolet light emitting LED.

It has become apparent that, among conventional phosphors used in white LED lamps, the red light emitting phosphor is inferior to other phosphors in luminescence efficiency with respect to ultraviolet light or violet light with a wavelength of not less than 380 nm and thus cannot satisfactorily enhance, for example, brightness properties of the white LED lamp. Further, the properties of blue and green light emitting phosphors cannot be satisfactorily exhibited due to the influence of the red light emitting phosphor having a poor luminescence efficiency. This is also causative of poor brightness properties.

The present invention has been made with a view to solving the problems of the present invention, and an object of the present invention is to provide a white LED lamp using an ultraviolet light emitting LED, which can simultaneously realize a high level of color rendering properties and a high level of brightness by virtue of an improvement in a combination of blue, green and red light emitting phosphors.

Means for Solving Problem

According to the present invention, there is provided a white LED lamp comprising a light emitting diode having a luminescence wavelength of not less than 360 nm and not more than 440 nm, and a light emitting part excitable upon exposure to light from the light emitting diode to emit white light and comprising a blue light emitting phosphor, a green light emitting phosphor, and a red light emitting phosphor, characterized in that the blue light emitting phosphor comprises at least one phosphor selected from europium-activated halophosphate phosphors and europium-activated aluminate phosphors, the green light emitting phosphor comprises a gold-and aluminum-activated zinc sulfide phosphor, and the red light emitting phosphor comprises at least one phosphor selected from europium-and samarium-activated lanthanum oxysulfide phosphors and copper-and manganese-activated zinc sulfide phosphors, and the blue light emitting phosphor, the green light emitting phosphor, and the red light emitting phosphor have previously been bonded to one another with a binder.

Effect of the Invention

In the white LED lamp according to the present invention, since a gold-and aluminum-activated zinc sulfide phosphor having a higher long-wavelength component content is used as a green light emitting phosphor, the light emitting component (red component) by the red light emitting phosphor can be reinforced. By virtue of this constitution, brightness properties can be improved without sacrificing a feature of a high level of color rendering properties inherent in the white LED lamp using an ultraviolet light emitting LED. Therefore, a white LED lamp, which can simultaneously realize a high level of color rendering properties and a high level of brightness, can be provided. Further, the white LED lamp according to the present invention has a small variation in luminescence chromaticity difference and, thus, even when is applied to a backlight using a plurality of LED lamps and a liquid crystal display device using the backlight, can suppress a chromaticity variation as a surface light source.

BRIEF DESCRIPTION OF THE DRAWINGS

FIG. 1 is a cross-sectional view showing the construction of a white LED lamp in one embodiment of the present invention.

FIG. 2 is a diagram showing a comparison of one example of a luminescence spectrum of a green light emitting phosphor to be applied to the present invention with a luminescence spectrum of a conventional green light emitting phosphor.

BEST MODE FOR CARRYING OUT THE INVENTION

Figure 3:
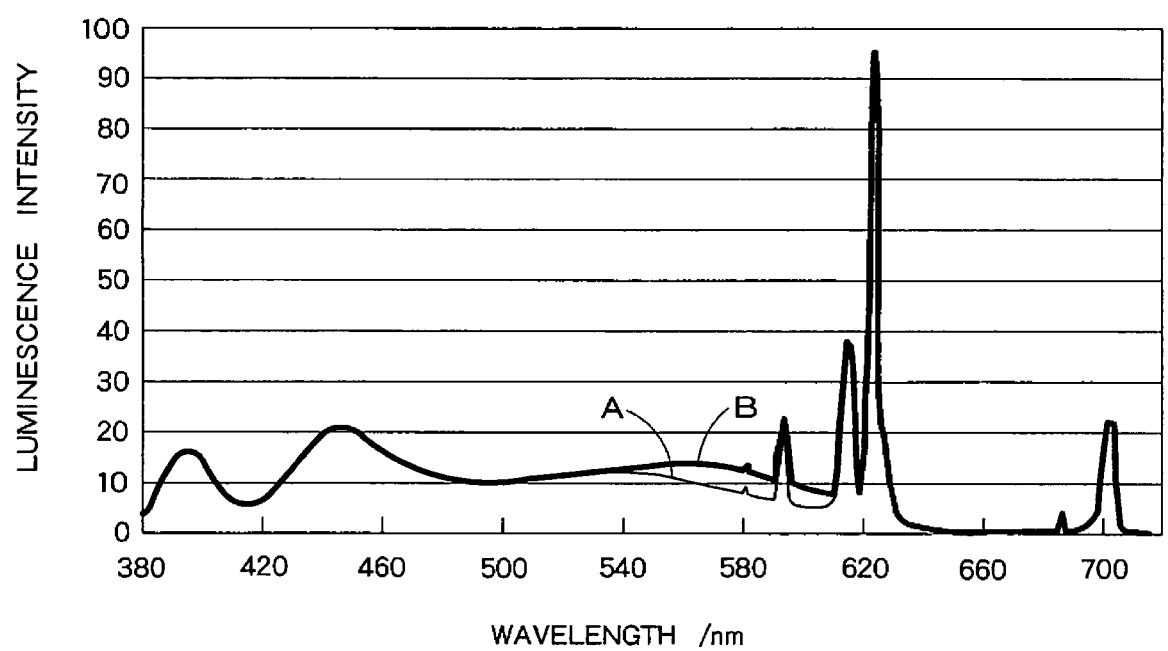
FIG. 3 is a diagram showing one example of a luminescence spectrum of a three-color phosphor to be applied to the present invention.

Embodiments of the present invention will be described with reference to the accompanying drawings. The embodiments of the present invention will be described in conjunction with the drawings. The drawings are provided for illustration purposes only, and the present invention is not limited to these drawings only.

FIG. 1 is a typical cross-sectional view showing the construction of a white LED lamp in one embodiment of the present invention. A white LED lamp 1 shown in the drawing comprises an LED chip 2 as a light source. This LED chip 2 is bonded onto a wiring board 4 having a lead terminal 3, and the LED chip 2 is electrically connected to the lead terminal 3 through a bonding wire 5. An ultraviolet light emitting LED, which emits ultraviolet light or violet light with a wavelength of 360 to 440 nm, is used in the LED chip. An example of the ultraviolet light emitting LED chip 2 is an LED chip comprising a nitride compound semiconductor layer as a luminescent layer.

A cylindrical resin frame 6 is provided on the wiring board 4, and a reflective layer 7 is provided on the inner wall face of the resin frame 6. The inside of the resin frame 6 is filled with a transparent resin 8, and an LED chip 2 is embedded in the transparent resin 8. The transparent resin 8 in which the LED chip 2 has been embedded, contains a phosphor containing a blue light emitting phosphor, a green light emitting phosphor, and a red light emitting phosphor (a three-color phosphor) 9. The three-color phosphor 9 dispersed in the transparent resin 8 is excited upon exposure to ultraviolet light or violet light emitted from the LED chip 2 to emit white light.

Specifically, electric energy applied to the white LED lamp 1 is converted, in the LED chip 2, to ultraviolet light or violet light which is then converted to a longer-wavelength light by the three-color phosphor 9 dispersed in the transparent resin 8. Based on the three-color phosphor 9 contained in the transparent resin 8, white light is emitted from the LED lamp 1. The transparent resin 8 containing the three-color phosphor 9 functions as a light emitting part and is disposed in front of the LED chip 2 in its light emitting direction. The light emitting part and the LED chip 2 as the light source constitute a white LED lamp (white light emitting lamp) 1. The transparent resin 8 containing the three-color phosphor 9 may be, for example, a silicone resin or an epoxy resin.

Phosphors, which can efficiently absorb ultraviolet light or violet light with a wavelength of 360 to 440 nm emitted from the LED chip 2, is preferably used as the blue, green and red light emitting phosphors constituting the three-color phosphor 9. Among these color light emitting phosphors, at least one phosphor selected from europium(Eu)-activated halophosphate phosphors and europium(Eu)-activated aluminate phosphors having excellent ultraviolet light or violet light absorption efficiency is used as the blue light emitting phosphor.

Examples of europium(Eu)-activated halophosphate phosphors include phosphors having a composition represented by general formula $$(M1_{1-c}, Eu_c)_{10}(PO_4)_6 \cdot Cl_2 \tag{1}$$

wherein M1 represents at least one element selected from magnesium (Mg), calcium (Ca), strontium (Sr), and barium (Ba); and c is a number satisfying $0.005 \leq c \leq 0.03$.

Examples of europium(Eu)-activated aluminate phosphors include phosphors having a composition represented by general formula $$m(M2_{1-d}, Eu_d)O \cdot nAl_2O_3 \tag{2}$$

wherein M2 represents at least one element selected from magnesium (Mg), calcium (Ca), strontium (Sr), barium (Ba), and zinc (Zn); and d, m, and n are numbers satisfying $0.05 \leq d \leq 0.3$, $0 < m$, $0 < n$, and $0.2 \leq m/n \leq 1.5$, respectively.

Further, at least one phosphor selected from europium (Eu)-and samarium(Sm)-activated lanthanum oxysulfide phosphors and copper(Cu)-and manganese(Mn)-activated zinc sulfide phosphors is used as the red light emitting phosphor.

Examples of the europium(Eu)-and samarium(Sm)-activated lanthanum oxysulfide phosphors include phosphors having a composition represented by general formula $$(La_{1-a-b}, Eu_a, Sm_b)_2O_2S \quad (3)$$

wherein a and b are numbers satisfying $0.01 \leq a \leq 0.15$ and $0.0001 \leq b \leq 0.03$, respectively.

Examples of copper(Cu)-and manganese(Mn)-activated zinc sulfide phosphors include phosphors having a composition represented by general formula $$ZnS:Cu_v, Mn_w \quad (4)$$

wherein v and w are numbers satisfying $0.0002 \leq v \leq 0.001$ and $0.005 \leq w \leq 0.014$, respectively.

Both the red light emitting phosphors represented by formulae (3) and (4) can be utilized as a red light emitting component for emitting light in the ultraviolet light emitting LED chip 2. When the luminescence properties (for example, luminescence intensity) of the red light emitting component is taken into consideration, however, the use of at least a europium(Eu)-and samarium(Sm)-activated lanthanum oxysulfide phosphor as the red light emitting component is preferred. Further, when only the europium(Eu)-and samarium(Sm)-activated lanthanum oxysulfide phosphor is used as the red light emitting component, the content of the red light emitting component is unsatisfactory. Accordingly, in this case, the combined use of the europium(Eu)-and samarium(Sm)-activated lanthanum oxysulfide phosphor and the copper(Cu)-and manganese(Mn)-activated zinc sulfide phosphor is useful.

In the above red light emitting phosphor, the luminescence efficiency with respect to ultraviolet light or violet light with a wavelength in the range of 360 to 440 nm is not always satisfactory. The combined use of the europium(Eu)-and samarium(Sm)-activated lanthanum oxysulfide phosphor and the copper(Cu)-and manganese(Mn)-activated zinc sulfide phosphor reinforces the red light emitting component but, on the other hand, the luminescence efficiency and the like are inferior to that of the blue and green light emitting phosphors. Accordingly, in the white LED lamp 1 in this embodiment, a green light emitting phosphor having a higher long-wavelength component content than the conventional green light emitting component is used. Specifically, a gold(Au)-and aluminum(Al)-activated zinc sulfide phosphor is used.

For example, a phosphor having a composition represented by general formula (5) may be used as the gold(Au)-and aluminum(Al)-activated zinc sulfide phosphor:

$$ZnS:Au_x, Al_y \quad (5)$$

wherein x and y are numbers satisfying $0.0002 \leq x \leq 0.0015$ and $0.0001 \leq y \leq 0.0012$, respectively. When the value of x (molar ratio of gold based on one mole of ZnS) in formula (5) is less than 0.0002, the luminescence chromaticity is shifted toward blue making it impossible to provide a desired color. On the other hand, when the value of x is more than 0.0015, the color of the phosphor is poor and the brightness is lowered. Further, when the value of y (molar ratio of aluminum based on one mole of ZnS) in formula (5) is less than 0.0001, gold cannot be activated in zinc sulfide, resulting in deteriorated brightness. On the other hand, when the value of y exceeds 0.0012, the color of the phosphor is deteriorated resulting in deteriorated brightness.

In FIG. 2, a luminescence spectrum (a) of a gold(Au)-and aluminum(Al)-activated zinc sulfide phosphor (ZnS:Au,Al phosphor) is shown in comparison with a luminescence spectrum (b) of the conventional copper(Cu)-and aluminum(Al)-activated zinc sulfide phosphor (ZnS:Cu,Al phosphor) and a luminescence spectrum (c) of a europium(Eu)-and manganese(Mn)-activated aluminate phosphor (3(Ba, Mg, Eu, Mn)O.8Al$_2$O$_3$ phosphor). As is apparent from FIG. 2, as compared with the conventional copper(Cu)-and aluminum (Al)-activated zinc sulfide phosphor and europium(Eu) and manganese(Mn)-activated aluminate phosphor, the gold (Au)-and aluminum(Al)-activated zinc sulfide phosphor has a higher long-wavelength component content and thus can reinforce the red light emitting component.

The three-color phosphor 9 containing blue, green and red light emitting phosphor can emit a light containing a light component with a wavelength around 450 nm, a light component with a wavelength around 560 nm, and a light component with a wavelength around 620 nm in a good balance. Accordingly, color rendering properties of white light can be enhanced. In addition to the three-color phosphor, a green light emitting phosphor formed of a gold(Au)-and aluminum (Al)-activated zinc sulfide phosphor (ZnS:Au, Al phosphor) having a higher long-wavelength component content than the conventional green light emitting component is used, and, thus, for example, luminescence from the red light emitting phosphor can be reinforced. According to the above construction, the brightness balance among the blue, green and red light emitting components can be improved, and, thus, the brightness properties of the white LED lamp 1 using the ultraviolet light emitting LED chip 2 can be enhanced. Therefore, a white LED lamp 1 which can simultaneously realize a high level of color rendering properties and a high level of brightness, can be provided.

The effect of improving brightness properties of the white LED lamp 1 by the green light emitting phosphor (ZnS:Au, Al phosphor) can be attained in both the case where a europium (Eu)-and samarium(Sm)-activated lanthanum oxysulfide phosphor is used as a red light emitting phosphor and the case where a copper(Cu)-and manganese(Mn)-activated zinc sulfide phosphor is used as a red light emitting phosphor. Further, from the viewpoint of attaining the effect of improving the brightness properties by the red light emitting phosphor per se, the combined use of the europium(Eu)-and samarium (Sm)-activated lanthanum oxysulfide phosphor and the copper(Cu)-and manganese(Mn)-activated zinc sulfide phosphor as the red light emitting phosphor is preferred. According to the above constitution, the red light emitting component is further reinforced, and, thus, the brightness properties of the white LED lamp 1 can be further enhanced. The mixing ratio of the red light emitting phosphors may vary depending, for example, upon the contemplated color temperature of the white light. For example, the mixing ratio between the europium(Eu)-and samarium(Sm)-activated lanthanum oxysulfide phosphor and the copper(Cu)-and manganese (Mn)-activated zinc sulfide phosphor is preferably in the range of 3:7 to 7:3 on a mass basis.

FIG. 3 is a diagram showing one example of a luminescence spectrum of a white LED lamp 1 using the above three-color phosphor 9 containing blue, green and red light emitting phosphors. In FIG. 3, spectrum A is a luminescence spectrum of a white LED lamp using a europium(Eu)-activated halophosphate phosphor as a blue light emitting component, a gold(Au)-and aluminum(Al)-activated zinc sulfide phosphor as a green light emitting component, and a europium(Eu)-and samarium(Sm)-activated lanthanum oxysulfide phosphor as a red light emitting phosphor. On the other hand, spectrum B is a luminescence spectrum of a white LED lamp 1 comprising the above combination of phosphors in the spectrum A and a copper(Cu)-and manganese(Mn)-activated zinc sulfide phosphor added as a red light emitting component to the combination.

For both the combinations A and B of phosphors, upon the conversion of ultraviolet light from an LED chip (current value 20 mA, peak value 400 nm) to white light having chromaticity of x=0.300 to 0.350 and y=0.300 to 0.350, the peak value of the blue light emitting component, the peak value of the green light emitting component, and the peak value of the red light emitting component are 450 nm, 545 nm, and 623 nm, respectively. In this case, property values of not less than 90 as the average color rendering index and not less than 300 mcd as the brightness are provided. Further, comparison of the luminescence spectra A and B shows that, for the luminescence spectrum B, the content of the light emitting component in a wavelength around and more than 580 nm is increased as compared with the luminescence spectrum A. This is based on the combined use of the europium(Eu)-and samarium(Sm)-activated lanthanum oxysulfide phosphor and the copper(Cu)-and manganese (Mn)-activated zinc sulfide phosphor as the red light emitting phosphor, whereby the brightness properties of the white LED lamp 1 can be further enhanced.

In the present invention, the above blue, green and red light emitting phosphors are preferably dispersed in the transparent resin 8 in such a state that these phosphors have previously been bonded to one another with a binder such as an inorganic binder or an organic binder, from the viewpoint of enhancing the homogeneity of the dispersed state of each color light emitting phosphor in the transparent resin 8. The inorganic binder may be, for example, pulverized alkaline earth borate. The organic binder may be a transparent resin such as an acrylic resin or a silicone resin. When Integration treatment is carried out, for example, with the inorganic binder or organic binder, the phosphors are randomly bonded to one another to form particles an increased particle diameter. According to the above constitution, for example, the heterogeneity of the dispersed state based on the precipitation speed difference of each phosphor in the transparent resin 8 can be eliminated, and, thus, for example, the reproduction of white light and the homogeneity of luminescence chromaticity (reduced variation in chromaticity difference) can be enhanced.

Further, the particle diameter of each phosphor also affects the brightness properties of the white LED lamp 1. From this viewpoint, the average particle diameter of a mixture of the blue, green and red light emitting phosphors is preferably not less than 7 μm. The average particle diameter referred to herein means the median value (50% value) in a particle size distribution. When the average particle diameter of the three-color phosphor 9 is not less than 7 μm, the brightness of the white LED lamp 1 can be further enhanced. The average particle diameter of the three-color phosphor (mixed phosphor) 9 is more preferably not less than 8 μm. The effect of improving the brightness based on the average particle diameter of the three-color phosphor 9 is also effective for phosphors subjected to the above-described integration treatment (bonding step).

In the white LED lamp according to the present invention, uniform LEDs having no significant variation in chromaticity between individual LEDs can be provided. Accordingly, the white LED lamp is particularly useful in fields where a plurality of LEDs are used, for example, in backlights in liquid crystal display devices. The white LED lamp is useful for any of upright-type and side light-type backlights. The white LED lamp is particularly useful for a backlight in which 10 or more white LED lamps are arranged.

EXAMPLES

Examples of the present invention and the results of evaluation will be described.

Example 1

A europium(Eu)-activated alkaline earth chlorophosphate $((Sr_{0.59}, Ca_{0.01}, Ba_{0.39}, Eu_{0.01})_{10}(PO_4)_6.Cl_2)$ phosphor, a gold (Au)-and aluminum(Al)-activated zinc sulfide (ZnS: $Au_{0.0008}$, $Al_{0.001}$) phosphor, and a europium(Eu)-and samarium(Sm)-activated lanthanum oxysulfide $((La_{0.94}, Eu_{0.058}, Sm_{0.002})_2O_2S)$ phosphor were provided as a blue light emitting phosphor, a green light emitting phosphor, and a red light emitting phosphor, respectively.

1.74 g of the blue light emitting phosphor, 2.17 g of the green light emitting phosphor, and 2.33 g of the red light emitting phosphor were weighed and were bonded to one another by the following bonding step. The mixing ratio of the phosphors was set so that the CIE chromaticity (x, y) of an LED lamp is x=0.30 to 0.31 and y=0.30 to 0.31. This is true of Examples 2 to 5 and Comparative Examples 1 and 2. The average particle diameter (distribution median diameter) of the mixed phosphor was 9.5 μm.

An LED lamp 1 as shown in FIG. 1 was produced using the mixed phosphor. The bonding step was carried out as follows. The phosphors which emits respective color lights were introduced into water to prepare a suspension. Barium calcium borate $(3(Ba, Ca)O.B_2O_3)$ (0.1% by mass based on the total amount of the phosphors) was added to the suspension while stirring the suspension. The stirring was continued for 30 min and was then stopped to cause phosphor precipitation. The precipitate was collected by filtration, was baked, and was then passed through a nylon sieve of 200 meshes to provide an integrated three-color phosphor mixture.

The LED lamp 1 was produced as follows. The mixed phosphor (30% by mass) was first added to and mixed with a silicone resin constituting a transparent resin 8 to give a slurry. This slurry was dropped on an ultraviolet light emitting LED chip 2 with a luminescence peak wavelength of 400 nm and a size of 300 μm square, and the silicone resin was cured at 140° C. to seal the ultraviolet light emitting LED chip 2 with the silicone resin containing the mixed phosphor (mixed phosphor composed of blue, green and red light emitting phosphors). The LED lamp thus produced was evaluated for characteristics which will be described later.

Example 2

The same phosphors as in Example 1 were provided in the same respective amounts as in Example 1. The phosphors were bonded to one another. The bonding step was carried out as follows. An acrylic resin emulsion (0.1% by mass on a solid basis) was added to each of the phosphors, and the phosphors were then mixed together. The mixture was dried at 120° C., and the dried product was then passed through a nylon mesh to produce an integrated phosphor. An LED lamp was produced in the same manner as in Example 1, except that the integrated phosphor. This LED lamp was evaluated for characteristics which will be described later.

Example 3

The same green light emitting phosphor and red light emitting phosphor as in Example 1 were provided. Further, a copper(Cu)-and manganese(Mn)-activated zinc sulfide (ZnS: $Cu_{0.0005}$, $Mn_{0.008}$) phosphor as a red light emitting phosphor and $3(Ba_{0.4}, Mg_{0.5}, Eu_{0.1})O \cdot 8Al_2O_3$ as a blue light emitting phosphor were provided. 2.10 g of the europium(Eu)-activated alkaline earth aluminate, 2.22 g of the gold-and aluminum-activated zinc sulfide phosphor, 2.10 g of the europium (Eu)- and samarium(Sm)-activated lanthanum oxysulfide phosphor, and 0.82 g of the copper(Cu)-and manganese(Mn)-activated zinc sulfide phosphor were weighed and were mixed and bonded to one another in the same manner as in Example 1. An LED lamp was produced in the same manner as in Example 1, except that the bonded phosphor thus obtained was used. The LED lamp was evaluated for characteristics which will be described later.

Examples 4 and 5

A mixed or integrated phosphor was produced in the same manner as in Example 1 or Example 2, except that a combination of blue, green and red light emitting phosphors shown in Table 1. LED lamps were produced in the same manner as in Example 1, except that the mixed or integrated phosphors were used. The LED lamps thus obtained were evaluated for characteristics which will be described later.

Comparative Example 1

A europium(Eu)-activated alkaline earth chlorophosphate $((Sr, Ca, Ba, Eu)_{10}(PO_4)_6 \cdot Cl_2)$ phosphor, a europium (Eu)- and manganese(Mn)-activated alkaline earth aluminate $(3(Ba, Mg, Eu, Mn)O \cdot 8Al_2O_3)$ phosphor, and a europium (Eu)-activated lanthanum oxysulfide $((La,Eu)_2O_2S)$ phosphor were provided as a blue light emitting phosphor, a green light emitting phosphor and a red light emitting phosphor, respectively. 1.44 g of the blue light emitting phosphor, 1.49 g of the green light emitting phosphor, and 3.32 g of the red light emitting phosphor were weighed and were mixed together in a three-roll mill. An LED lamp was produced in the same manner as in Example 1, except that this mixed phosphor was used. This LED lamp was evaluated for characteristics which will be described later. In Comparative Example 1, the bonding step was not carried out.

Comparative Example 2

A europium(Eu)-activated alkaline earth chlorophosphate $((Sr, Ca, Ba, Eu)_{10}(PO_4)_6 \cdot Cl_2)$ phosphor, a europium(Eu)-activated alkaline earth silicate $((Ba, Sr, Ca, Eu)_2SiO_4)$ phosphor, and a europium(Eu)-activated lanthanum oxysulfide $((La, Eu)_2O_2S)$ phosphor were provided as a blue light emitting phosphor, a green light emitting phosphor and a red light emitting phosphor, respectively. 2.71 g of the blue light emitting phosphor, 0.45 g of the green light emitting phosphor, and 1.85 g of the red light emitting phosphor were weighed and were mixed together in a three-roll mill. An LED lamp was produced in the same manner as in Example 1, except that this mixed phosphor was used. This LED lamp was evaluated for characteristics which will be described later. In Comparative Example 2, the bonding step was not carried out.

TABLE 1

|  | Blue light emitting phosphor | Green light emitting phosphor | Red light emitting phosphor | State of three-color phosphor |
|---|---|---|---|---|
| Ex. 1 | $(Sr,Ca,Ba,Eu)_{10}(PO_4)_6 \cdot Cl_2$ | ZnS: Au, Al | $(La,Eu,Sm)_2O_2S$ | Bonded |
| Ex. 2 | $(Sr,Ca,Ba,Eu)_{10}(PO_4)_6 \cdot Cl_2$ | ZnS: Au, Al | $(La,Eu,Sm)_2O_2S$ | Bonded |
| Ex. 3 | $3(Ba,Mg,Eu)O \cdot 8Al_2O_3$ | ZnS: Au, Al | $(La,Eu,Sm)_2O_2S$/ ZnS: Cu,Mn | Bonded |
| Ex. 4 | $3(Ba,Mg,Eu)O \cdot 8Al_2O_3$ | ZnS: Au, Al | $(La,Eu,Sm)_2O_2S$/ ZnS: Cu,Mn | Bonded |
| Ex. 5 | $(Sr,Ca,Ba,Eu)_{10}(PO_4)_6 \cdot Cl_2$ (50%)/ $3(Ba,Mg,Eu)O \cdot 8Al_2O_3$ (50%) | ZnS: Au, Al | $(La,Eu,Sm)_2O_2S$/ ZnS: Cu,Mn | Bonded |
| Comp. Ex. 1 | $(Sr,Ca,Ba,Eu)_{10}(PO_4)_6 \cdot Cl_2$ | $3(Ba,Mg,Eu,Mn)O \cdot 8Al_2O_3$ | $(La,Eu)_2O_2S$ | Mixed |
| Comp. Ex. 2 | $(Sr,Ca,Ba,Eu)_{10}(PO_4)_6 \cdot Cl_2$ | $(Ba,Sr,Ca,Eu)_2SiO_4$ | $(La,Eu)_2O_2S$ | Mixed |

A current of 20 mA was allowed to flow into each of the white LED lamps of Examples 1 to 5 and Comparative Examples 1 and 2 for lighting, and the brightness of luminescence, the average color rendering index, and chromaticity were measured for each of the white LED lamps. The results of measurement are shown in Table 2. For each of the white LED lamps, the luminescence characteristics were measured with CAS 140B COMPACT ARRAY SPECTROMETER manufactured by INSTRUMENT SYSTEMS and MCPD device manufactured by Otsuka Electronics Co., Ltd.

TABLE 2

| | Characteristics of white LED lamp | | |
|---|---|---|---|
| | Brightness (mcd) | Average of color rendering index | Chromaticity (x, y) |
| Ex. 1 | 305 | 92 | (0.304, 0.302) |
| Ex. 2 | 320 | 93 | (0.305, 0.303) |
| Ex. 3 | 280 | 91 | (0.304, 0.301) |
| Ex. 4 | 295 | 92 | (0.304, 0.302) |
| Ex. 5 | 310 | 92 | (0.304, 0.303) |
| Comp. Ex. 1 | 150 | 70 | (0.304, 0.303) |
| Comp. Ex. 2 | 250 | 81 | (0.304, 0.302) |

As is apparent from Table 2, the white LED lamps of Examples 1 to 5 had excellent color rendering properties and, at the same time, were superior in brightness properties to the white LED lamps of Comparative Examples 1 and 2. Accordingly, In white LED lamps using ultraviolet light emitting LED, a high level of color rendering properties and a high level of brightness could be simultaneously realized.

Next, a variation in chromaticity of the white light emitting LED lamps of Examples 1 to 5 was measured. Twenty white LEDs of each Example were provided. The chromaticity (CIE chromaticity coordinates) was measured just above each of the LEDs to determine the difference between the maximum value and the minimum value for x coordinate and y coordinate ($\Delta x$, $\Delta y$). Further, a reference white LED was produced in the same manner as in Example 1, except that the bonding step was not carried out. The results are shown in Table 3.

TABLE 3

|  | Δx | Δy |
|---|---|---|
| Example 1 | 0.01 | 0.02 |
| Example 2 | 0.03 | 0.02 |
| Example 3 | 0.02 | 0.03 |
| Example 4 | 0.02 | 0.01 |
| Example 5 | 0.01 | 0.02 |
| Reference Example | 0.05 | 0.05 |

As is apparent from Table 3, for the white LED of the Examples of the present invention, the variation in chromaticity was small. These white LED lamps can be effectively utilized as constituent components for various display devices, for example, for portable communication equipment, PC peripheral devices, OA equipment, domestic electric appliances, various switches, and backlight-type display boards, and, further, general lighting equipments.

In particular, by virtue of a small variation in chromaticity, even when these white LEDs are used in a backlight using a plurality of white LED lamps, a surface light source having a uniform white color can be provided. Accordingly, the characteristics of liquid crystal display devices using the surface light source can be improved.

The invention claimed is:

1. A white LED lamp comprising a light emitting diode having a luminescence wavelength of not less than 360 nm and not more than 440 nm, and a light emitting part excitable upon exposure to light from the light emitting diode to emit white light and comprising a blue light emitting phosphor, a green light emitting phosphor, and a red light emitting phosphor, wherein
the blue light emitting phosphor comprises at least one phosphor selected from europium-activated halophosphate phosphors and europium-activated aluminate phosphors, the red light emitting phosphor comprises at least one phosphor selected from europium- and samarium-activated lanthanum oxysulfide phosphors and copper- and manganese-activated zinc sulfide phosphors, and the green light emitting phosphor comprises a gold- and aluminum-activated zinc sulfide phosphor having a composition represented by general formula $ZnS:Au_x,Al_y$ wherein x and y are numbers satisfying $0.0002 \leq x \leq 0.0015$ and $0.0001 \leq y \leq 0.0012$, respectively, and
the blue light emitting phosphor, the green light emitting phosphor, and the red light emitting phosphor have previously been bonded to one another with a binder.

2. The white LED lamp according to claim 1, wherein the red light emitting phosphor comprises at least one phosphor selected from europium- and samarium-activated lanthanum oxysulfide phosphors having a composition represented by general formula $(La_{1-a-b},Eu_a,Sm_b)_2O_2S$ wherein a and b are numbers satisfying $0.01 \leq a \leq 0.15$ and $0.0001 \leq b \leq 0.03$, respectively; and
copper- and manganese-activated zinc sulfide phosphors having a composition represented by general formula $ZnS:Cu_v,Mn_w$ wherein v and w are numbers satisfying $0.0002 \leq v \leq 0.001$ and $0.005 \leq w \leq 0.014$, respectively.

3. The white LED lamp according to claim 1 wherein the red light emitting phosphor comprises both the europium- and samarium-activated lanthanum oxysulfide phosphors and copper- and manganese-activated zinc sulfide phosphors.

4. The white LED lamp according to claim 1 wherein the blue light emitting phosphor comprises at least one phosphor selected from europium-activated halophosphate phosphors having a composition represented by general formula $(M1_{1-c},Eu_c)_{10}(PO_4)_6 \cdot Cl_2$ wherein M1 represents at least one element selected from magnesium (Mg), calcium (Ca), strontium (Sr), and barium (Ba); and c is a number satisfying $0.005 \leq c \leq 0.03$; and
europium-activated aluminate phosphors having a composition represented by general formula $m(M2_{1-d},Eu_d)O \cdot nAl_2O_3$ wherein M2 represents at least one element selected from magnesium (Mg), calcium (Ca), strontium (Sr), barium (Ba), and zinc (Zn); and d, m, and n are numbers satisfying $0.05 \leq d \leq 0.3$, $0<m$, $0<n$, and $0.2 \leq m/n \leq 1.5$, respectively.

5. A backlight comprising a plurality of white LED lamps according to any one of claims 1 to 4.

6. A liquid crystal display device comprising a backlight according to claim claim 5.

7. The white LED lamp according to claim 4 wherein the red light emitting phosphor comprises at least one phosphor selected from europium- and samarium-activated lanthanum oxysulfide phosphors having a composition represented by general formula $(La_{1-a-b},Eu_a,Sm_b)_2O_2S$ wherein a and b are numbers satisfying $0.01 \leq a \leq 0.15$ and $0.0001 \leq b \leq 0.03$, respectively; and
copper- and manganese-activated zinc sulfide phosphors having a composition represented by general formula $ZnS:Cu_v,Mn_w$ wherein v and w are numbers satisfying $0.0002 \leq v \leq 0.001$ and $0.005 \leq w \leq 0.014$, respectively.

8. The white LED lamp according to claim 3 wherein the blue light emitting phosphor comprises at least one phosphor selected from europium-activated halophosphate phosphors having a composition represented by general formula $(M1_{1-c},Eu_c)_{10}(PO_4)_6 \cdot Cl_2$ wherein M1 represents at least one element selected from magnesium (Mg), calcium (Ca), strontium (Sr), and barium (Ba); and c is a number satisfying $0.005 \leq c \leq 0.03$; and
europium-activated aluminate phosphors having a composition represented by general formula $m(M2_{1-d},Eu_d)O \cdot nAl_2O_3$ wherein M2 represents at least one element selected from magnesium (Mg), calcium (Ca), strontium (Sr), barium (Ba), and zinc (Zn); and d, m, and n are numbers satisfying $0.05 \leq d \leq 0.3$, $0<m$, $0<n$, and $0.2 \leq m/n \leq 1.5$, respectively.

* * * * *